US009935191B2

(12) United States Patent
Jun et al.

(10) Patent No.: US 9,935,191 B2
(45) Date of Patent: Apr. 3, 2018

(54) HIGH ELECTRON MOBILITY TRANSISTOR FABRICATION PROCESS ON REVERSE POLARIZED SUBSTRATE BY LAYER TRANSFER (71) Applicant: Intel Corporation, Santa Clara, CA (US)

(72) Inventors: Kimin Jun, Hillsboro, OR (US); Sansaptak Dasgupta, Hillsboro, OR (US); Alejandro X. Levander, Santa Clara, CA (US); Patrick Morrow, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/122,627

(22) PCT Filed: Jun. 13, 2014

(86) PCT No.: PCT/US2014/042389
§ 371 (c)(1),
(2) Date: Aug. 30, 2016

(87) PCT Pub. No.: WO2015/191088
PCT Pub. Date: Dec. 17, 2015

(65) Prior Publication Data
US 2017/0077281 A1    Mar. 16, 2017

(51) Int. Cl.
H01L 29/15    (2006.01)
H01L 31/0256    (2006.01)
(Continued)

(52) U.S. Cl.
CPC ...... *H01L 29/7787* (2013.01); *H01L 21/0254* (2013.01); *H01L 21/02609* (2013.01);
(Continued)

(58) Field of Classification Search
CPC ........... H01L 29/7787; H01L 29/66462; H01L 21/0254; H01L 29/205; H01L 21/02609;
(Continued)

(56) References Cited

U.S. PATENT DOCUMENTS

2009/0075455 A1    3/2009    Mishra
2010/0301347 A1    12/2010   Chung et al.
2012/0061680 A1    3/2012    Lee et al.

FOREIGN PATENT DOCUMENTS

KR    20140022131    2/2014
TW    201417148      5/2014
(Continued)

OTHER PUBLICATIONS

Machine Translation of KR-20140022131 A (Note KR-20140022131 is listed in the IDS filed Aug. 30, 2016), published Feb. 24, 2014.*

(Continued)

*Primary Examiner* — Stephen W Smoot
*Assistant Examiner* — Vicki B Booker
(74) *Attorney, Agent, or Firm* — Schwabe, Williamson & Wyatt P.C.

(57) ABSTRACT

A method including forming a barrier layer on a polar compound semiconductor layer on a sacrificial substrate; coupling the sacrificial substrate to a carrier substrate to form a composite structure wherein the barrier layer is disposed between the polar compound semiconductor layer and the carrier substrate; separating the sacrificial substrate from the composite structure to expose the polar compound semiconductor layer; and forming at least one circuit device. An apparatus including a barrier layer on a substrate; a transistor device on the barrier layer; and a polar compound semiconductor layer disposed between the barrier layer and the transistor device, the polar compound semiconductor layer including a two-dimensional electron gas therein.

17 Claims, 4 Drawing Sheets (51) Int. Cl.
- *H01L 29/778* (2006.01)
- *H01L 29/20* (2006.01)
- *H01L 21/02* (2006.01)
- *H01L 21/78* (2006.01)
- *H01L 29/04* (2006.01)
- *H01L 29/205* (2006.01)
- *H01L 29/66* (2006.01)

(52) U.S. Cl.
CPC ........ *H01L 21/7806* (2013.01); *H01L 29/045* (2013.01); *H01L 29/2003* (2013.01); *H01L 29/205* (2013.01); *H01L 29/66462* (2013.01); *H01L 29/7781* (2013.01)

(58) Field of Classification Search
CPC ............... H01L 29/045; H01L 29/2003; H01L 21/7806
See application file for complete search history.

(56) References Cited

FOREIGN PATENT DOCUMENTS

| WO | WO-2008121976 | 10/2008 |
|---|---|---|
| WO | WO-2014031229 | 2/2014 |

OTHER PUBLICATIONS

Intel Corporation, et al., "International Preliminary Report on Patentability", PCT/US2014/042389, (dated Dec. 22, 2016).

Intel Corporation, "Office Action", TW Application No. 104114132, (dated Oct. 28, 2016).

Intel Corporation, et al., "International Search Report and Written Opinion", PCT/US2014/042389, (dated Mar. 13, 2015).

Intel Corporation, "Office Action and Search Report", TW Application No. 104114132, (dated May 5, 2016).

Search Report for European Patent App. No. 14894669.2, dated Jan. 19, 2018, 9 pages.

* cited by examiner

HIGH ELECTRON MOBILITY TRANSISTOR FABRICATION PROCESS ON REVERSE POLARIZED SUBSTRATE BY LAYER TRANSFER

CROSS-REFERENCE TO RELATED APPLICATION

This patent application is a U.S. National Phase Application under 35 U.S.C. § 371 of International Application No. PCT/US2014/042389, filed Jun. 13, 2014, entitled HIGH ELECTRON MOBILITY TRANSISTOR FABRICATION PROCESS ON REVERSE POLARIZED SUBSTRATE BY LASER TRANSFER.

BACKGROUND

Field

Compound semiconductor devices.

Description of Related Art

Compound semiconductor devices are viewed as promising alternatives or complements to silicon-based devices. Compound semiconductor may be described generally as binary or tertiary group III-V semiconductor materials. The group III-V reference denotes elements in group XIII and XV of the periodic table, respectively. The group III and group V notations reference the former International Union of Pure Applied Chemistry (IUPAC) numbers.

A binary compound semiconductor such as gallium nitride has a wurzite crystal structure and a crystal polarity. Gallium nitride high electron mobility transistors (HEMTs) are used in wireless infrastructure applications. Gallium nitride base metal oxide semiconductor field effect transistors (MOSFETs) and metal semiconductor field effect transistors (MESFETs) also offer advantages in high power electronics.

Heterogeneous integration schemes generally involve integration of different semiconductor materials to make a virtual substrate. Layer transfer of a semiconductor layer to a substrate is a promising method to make a virtual substrate, because a relatively thick buffer layer may be avoided between lattice mismatched materials. In terms of the viability of layer transfer of gallium nitride, gallium nitride fabrication schemes tend to prefer a certain crystal polarity, namely positive or +c surface polarity. Efforts to transfer a polar compound semiconductor layer such as gallium nitride layer fabricated according to such schemes tend to result in a transfer of a semiconductor layer with a +c polar surface available for a device formation.

DETAILED DESCRIPTION

A method of making an integrated circuit device, particularly an integrated circuit device including high electron mobility transistors (HEMTs), by a layer transfer is described. In one aspect, the method allows selection of a desired surface polarity for a layer of a polar semiconductor material such as a polar compound semiconductor material. An apparatus is also described that, in one aspect, includes a transistor device on a polar compound semiconductor layer as it is a system including a computing device comprising a microprocessor coupled to a printed circuit board, the microprocessor including a plurality of transistor devices such as a plurality of HEMTs.

In the following description, various aspects of the illustrative implementations will be described using terms commonly employed by those skilled in the art to convey the substance of their work to others skilled in the art. However, it will be apparent to those skilled in the art that embodiments may be practiced with only some of the described aspects. For purposes of explanation, specific numbers, materials and configurations are set forth in order to provide a thorough understanding of the illustrative implementations. However, it will be apparent to one skilled in the art that the embodiments may be practiced without the specific details. In other instances, well-known features are omitted or simplified in order not to obscure the illustrative implementations.

Various operations will be described as multiple discrete operations, in turn, in a manner that is most helpful in understanding the embodiments described herein, however, the order of description should not be construed to imply that these operations are necessarily order dependent. In particular, these operations need not be performed in the order of presentation.

Each HEMT includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one work function metal such as titanium nitride, nickel, platinum or tungsten. In some implementations, the gate electrode layer may consist of a stack of two or more metal layers, where one or more metal layers are workfunction metal layers and at least one metal layer is a fill metal layer.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations, the gate electrode may consist of a combination of U-shaped structures and planar, non-U-shaped structures. For example, the gate electrode may consist of one or more U-shaped metal layers formed atop one or more planar, non-U-shaped layers.

In some implementations, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In an alternate implementation, a plurality of spacer pairs may be used, for instance, two pairs, three pairs, or four pairs of sidewall spacers may be formed on opposing sides of the gate stack.

As is known in the art, source and drain regions are formed within the substrate adjacent to the gate stack of each HEMT. The source and drain regions are generally formed using either an implantation/diffusion process or an etching/deposition process. In the former process, dopants such as silicon may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be doped in situ with dopants such as silicon or germanium. In further embodiments, the source and drain regions may be formed using one or more alternate semiconductor materials such as indium gallium nitride or gallium nitride or indium nitride or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Figure 1:
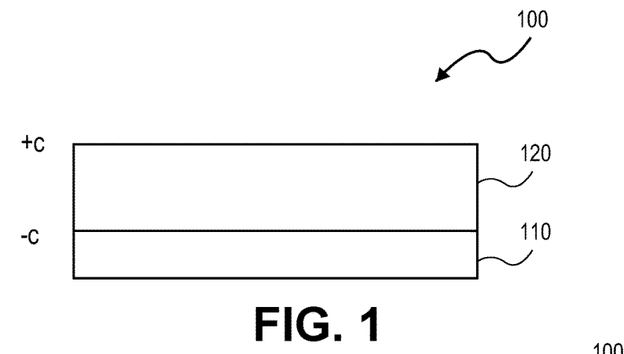
FIG. 1 shows a cross-sectional side view of a layer of a polar semiconductor material on a template or sacrificial substrate.

FIG. 1 shows a cross-sectional side view of a layer of a polar semiconductor material on a template or sacrificial substrate. Representatively, sacrificial substrate 110 is a single crystal silicon substrate, a polycrystalline semiconductor substrate, a silicon carbide substrate or a sapphire substrate. On one surface of sacrificial substrate 110 is a layer of a polar compound semiconductor material. A suitable polar compound semiconductor material is, in one embodiment, a material having a wurzite crystal structure, such as gallium nitride, aluminum nitride or zinc oxide. In one embodiment, polar compound semiconductor layer 120 is gallium nitride deposited to a thickness of 30 microns. In one embodiment, compound semiconductor layer 120 of a gallium nitride is formed by an epitaxial growth process. In the illustrated embodiment, layer 120 has a −c polarity at the interface with sacrificial substrate 110 and a +c polarity at an opposite surface.

Figure 2:
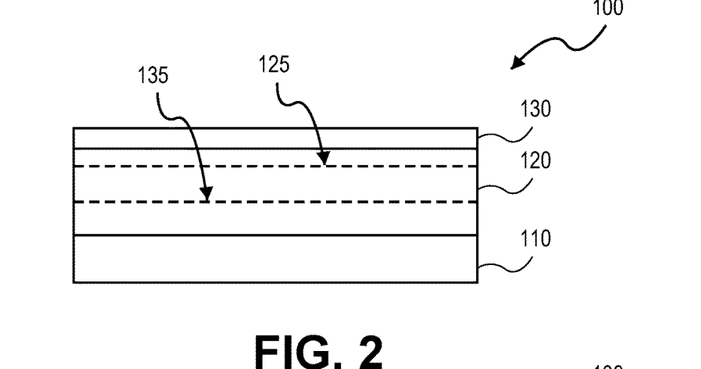
FIG. 2 shows the structure of FIG. 1 following the introduction of a barrier layer on the polar semiconductor layer.

FIG. 2 shows the structure of FIG. 1 following the introduction of a barrier layer on the polar semiconductor layer. FIG. 2 shows barrier layer 130 of a material having a thickness on the order of 20 nanometers (nm). In one embodiment, barrier layer 130 is a compound semiconductor material such as aluminum gallium nitride (AlGaN) that is representatively formed by an epitaxial process. In one embodiment, a material for barrier layer 130 is selected for its ability to induce a two-dimensional electron gas (2DEG) in layer 120. FIG. 2 shows 2DEG layer 125 formed in layer 120. Representatively 2DEG layer 125 is formed as few nanometers (e.g., two to four nanometers) below the interface of a surface of barrier layer 130 and a surface of polar compound semiconductor layer 120 as viewed.

FIG. 2 also shows structure 100 following the introduction of a perforation layer in polar compound semiconductor layer 120. In one embodiment, perforation layer 135 is formed by an ion cut, amorphous blistering or stress-induced spalling process. In one embodiment, perforation layer 135 is positioned tens of nanometers from the interface of a surface of polar compound semiconductor layer 120 from with a surface of barrier layer 130. Representatively, perforation layer 135 is 100 nanometers from the interface.

Figure 3:
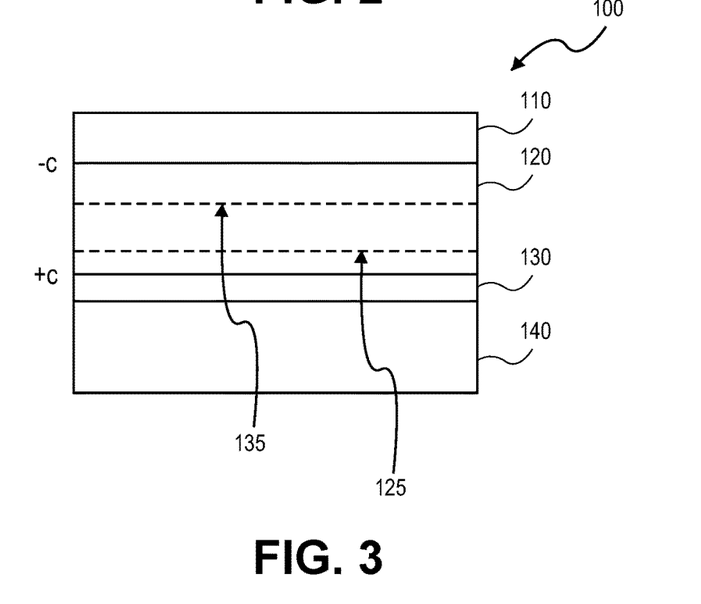
FIG. 3 shows the structure of FIG. 2 following the inversion of the structure and its connection to a carrier substrate to form a composite structure.

FIG. 3 shows the structure of FIG. 2 following the inversion of structure 100 and its connection to a carrier substrate to form a composite structure. FIG. 3 shows barrier layer 130 connected to a carrier substrate, notably carrier substrate 140. In one embodiment, carrier substrate 140 is, for example, a single crystal silicon substrate, a polycrystalline silicon substrate, a silicon carbide substrate or a sapphire substrate. As illustrated, structure 100 as shown in FIG. 2 is inverted or flipped so that a surface of barrier layer 130 is in contact with carrier substrate 140.

Figure 4:
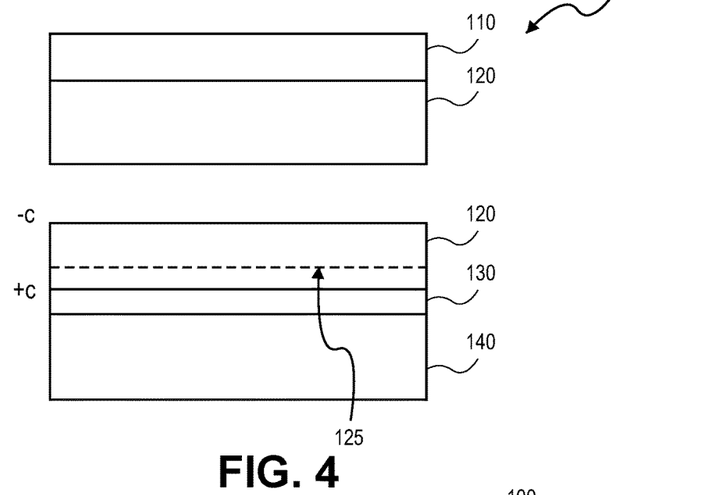
FIG. 4 shows the composite structure of FIG. 3 following the separation or division of the composite structure at a perforation layer in the polar semiconductor layer.

FIG. 4 shows the composite structure of FIG. 3 following the separation or division of the composite structure at the perforation layer. The separation exposes polar compound semiconductor layer 120 with a −c polarity at the exposed surface.

Figure 5:
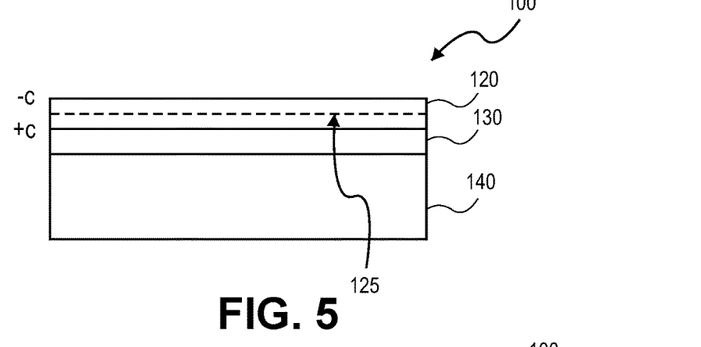
FIG. 5 shows the structure of FIG. 4 following a reduction of a thickness of the polar compound semiconductor layer on the structure.

FIG. 5 shows the structure of FIG. 4 following a reduction of a thickness of polar compound semiconductor layer 120 on the structure. In one embodiment, a thickness of polar compound semiconductor layer 120 may be reduced by grinding, polishing or etching. A representative target thickness is on the order of 10 nm.

Figure 6:
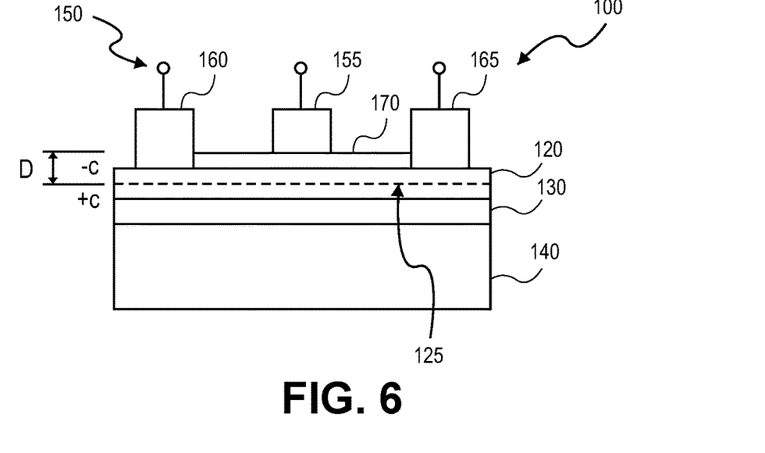
FIG. 6 shows the structure of FIG. 5 following the introduction of a device on the structure.

FIG. 6 shows the structure of FIG. 5 following the introduction of a device on the structure. The illustrated device is a transistor. FIG. 6 shows transistor 150 including gate electrode 155, source region 160 and drain region 165. Each of gate electrode 155, source region 160 and drain region 165 may be connected to an electrical contact through metallization. As illustrated, in one embodiment, prior to forming gate electrode 155 on structure 100, a dielectric layer, such as an oxide, may be formed on a portion of polar compound semiconductor layer 120 to provide a gate dielectric for the gate electrode. One way to form gate dielectric layer 170 of an oxide is by a growth technique. A representative thickness of gate dielectric layer 170 is on the order of one to two nanometers. It is appreciated that gate dielectric layer 170 can be omitted such as when forming a Schottky barrier between a gate electrode and compound semiconductor layer is desired.

Referring to FIG. 6, in one embodiment, a distance between gate electrode 155 and 2DEG layer 125 is a gate-channel separation illustrated as distance, D. Considering gate dielectric 170 can be as thin as about one nanometer, distance, D, primarily depends on the thickness of polar compound barrier layer 120. Layer transfer thickness can be precisely controlled and thinning process such as etching and/or polishing can make a compound semiconductor layer as thin as a few tens of nanometers or less. In such case, the gate-channel separation (the effective gate oxide thickness) of the flipped layer structure shown in FIG. 6 can be less than an effective gate oxide thickness of non-flipped structure where there is a barrier layer between the compound semiconductor layer and a gate electrode. The thinner gate-channel separation enables better gate control in depletion mode HEMT devices.

Figure 7:
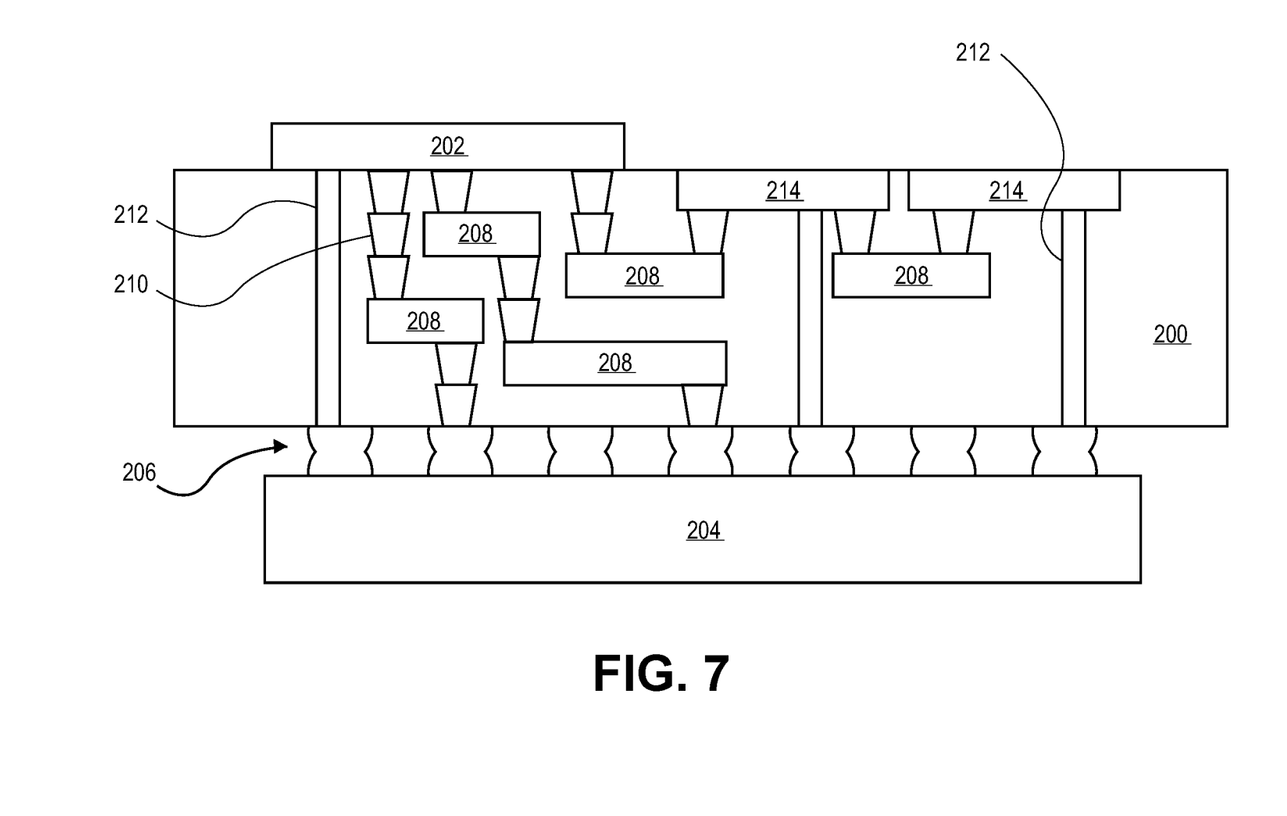
FIG. 7 is an interposer implementing one or more embodiments.

FIG. 7 illustrates an interposer 200 that includes one or more embodiments. The interposer 200 is an intervening substrate used to bridge a first substrate 202 to a second substrate 204. The first substrate 202 may be, for instance, an integrated circuit die. The second substrate 204 may be, for instance, a memory module, a computer motherboard, or another integrated circuit die. Generally, the purpose of an interposer 200 is to spread a connection to a wider pitch or to reroute a connection to a different connection. For example, an interposer 200 may couple an integrated circuit die to a ball grid array (BGA) 206 that can subsequently be coupled to the second substrate 204. In some embodiments, the first and second substrates 202/204 are attached to opposing sides of the interposer 200. In other embodiments, the first and second substrates 202/204 are attached to the same side of the interposer 200. And in further embodiments, three or more substrates are interconnected by way of the interposer 200.

The interposer 200 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 208 and vias 210, including but not limited to through-silicon vias (TSVs) 212. The interposer 200 may further include embedded devices 214, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 200.

In accordance with embodiments, apparatuses or processes disclosed herein may be used in the fabrication of interposer 200.

Figure 8:
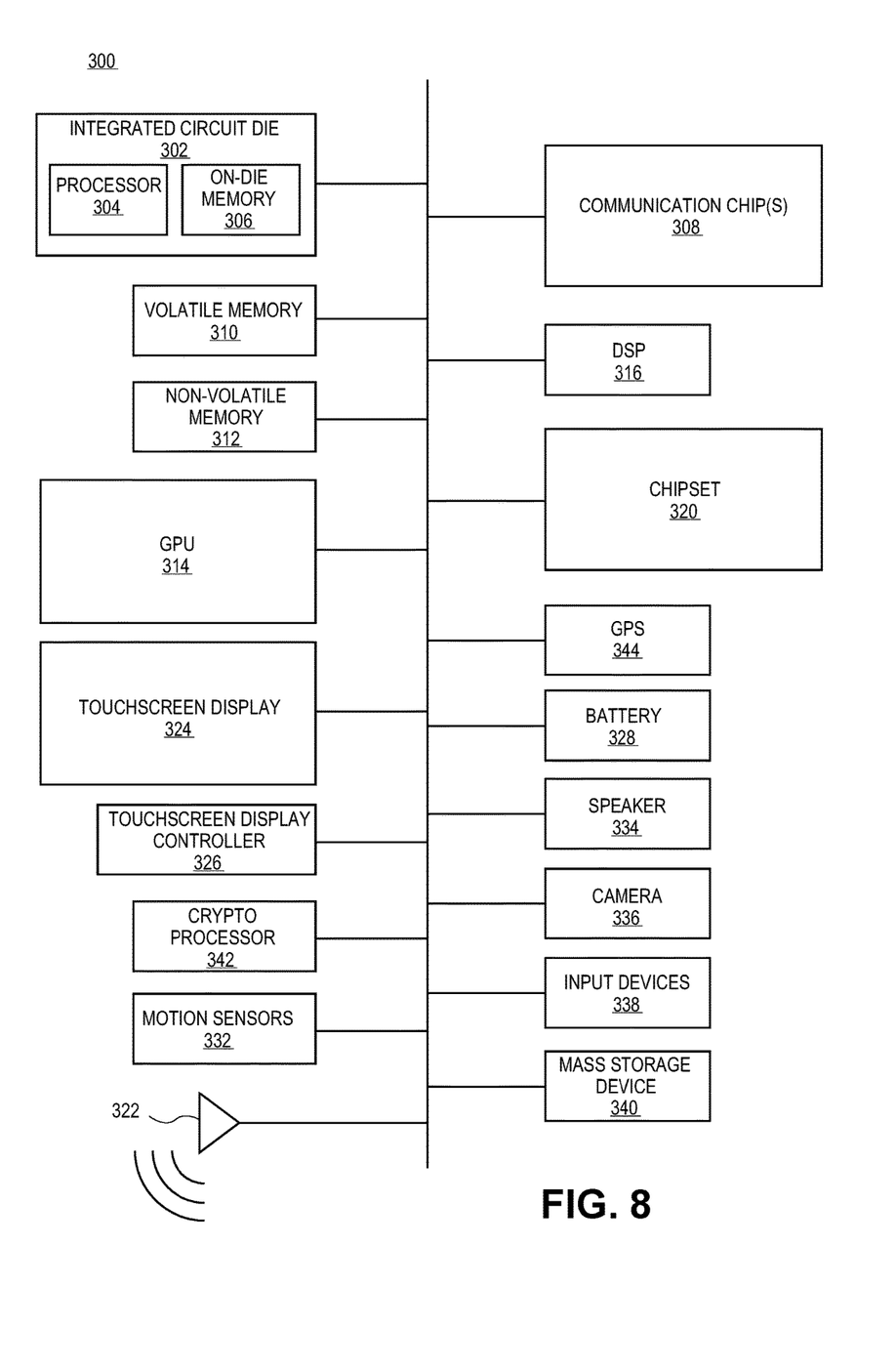
FIG. 8 is a computing device built in accordance with an embodiment.

FIG. 8 illustrates a computing device 300 in accordance with one embodiment. The computing device 300 may include a number of components. In one embodiment, these components are attached to one or more motherboards. In an alternate embodiment, these components are fabricated onto a single system-on-a-chip (SoC) die rather than a motherboard. The components in the computing device 300 include, but are not limited to, an integrated circuit die 302 and at least one communication chip 308. In some implementations the communication chip 308 is fabricated as part of the integrated circuit die 302. The integrated circuit die 302 may include a CPU 304 as well as on-die memory 306, often used as cache memory, that can be provided by technologies such as embedded DRAM (eDRAM) or spin-transfer torque memory (STTM or STTM-RAM).

Computing device 300 may include other components that may or may not be physically and electrically coupled to the motherboard or fabricated within an SoC die. These other components include, but are not limited to, volatile memory 310 (e.g., DRAM), non-volatile memory 312 (e.g., ROM or flash memory), a graphics processing unit 314 (GPU), a digital signal processor 316, a crypto processor 342 (a specialized processor that executes cryptographic algorithms within hardware), a chipset 320, an antenna 322, a display or a touchscreen display 324, a touchscreen controller 326, a battery 328 or other power source, a power amplifier (not shown), a global positioning system (GPS) device 344, a compass 330, a motion coprocessor or sensors 332 (that may include an accelerometer, a gyroscope, and a compass), a speaker 334, a camera 336, user input devices 338 (such as a keyboard, mouse, stylus, and touchpad), and a mass storage device 340 (such as hard disk drive, compact disk (CD), digital versatile disk (DVD), and so forth).

The communications chip 308 enables wireless communications for the transfer of data to and from the computing device 300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 308 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 300 may include a plurality of communication chips 308. For instance, a first communication chip 308 may be dedicated to shorter range wireless communications such as Wi-Fi and Bluetooth and a second communication chip 308 may be dedicated to longer range wireless communications such as GPS, EDGE, GPRS, CDMA, WiMAX, LTE, Ev-DO, and others.

The processor 304 of the computing device 300 includes one or more devices, such as transistors or metal interconnects, that are formed in accordance with embodiments described above. The term "processor" may refer to any device or portion of a device that processes electronic data from registers and/or memory to transform that electronic data into other electronic data that may be stored in registers and/or memory.

The communication chip 308 may also include one or more devices, such as transistors or metal interconnects, that are formed in accordance with embodiments described above.

In further embodiments, another component housed within the computing device 300 may contain one or more devices, such as transistors or metal interconnects, that are formed in accordance with implementations described above.

In various embodiments, the computing device 300 may be a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 300 may be any other electronic device that processes data.

EXAMPLES

Example 1 is a method including forming a barrier layer on a polar compound semiconductor layer on a sacrificial substrate; coupling the sacrificial substrate to a carrier substrate to form a composite structure wherein the barrier layer is disposed between the polar compound semiconductor layer and the carrier substrate; separating the sacrificial substrate from the composite structure to expose the polar compound semiconductor layer; and forming at least one circuit device.

In Example 2, the polar compound semiconductor layer of Example 1 has a first polarity at a junction with the barrier layer and a second different polarity at the surface exposed by separating the sacrificial substrate from the compound structure.

In Example 3, the first polarity of Example 2 is +c and the second polarity is −c.

In Example 4, forming a barrier layer of Example 1 includes depositing a material that induces a two-dimensional electron gas in the polar compound semiconductor layer.

In Example 5, prior to coupling, the method of Example 1 forming a perforation region in the compound semiconductor layer and separating the sacrificial substrate includes separating at the perforation region.

In Example 6, after separating the sacrificial substrate, the method of Example 5 includes thinning the compound semiconductor layer.

In Example 7, forming at least one circuit device of Example 6 includes forming a transistor including a gate electrode on a gate dielectric layer.

Example 8 is an integrated circuit device made by any of the methods of Examples 1-7.

Example 9 is an apparatus including a barrier layer on a substrate; a transistor device on the barrier layer; and a polar compound semiconductor layer disposed between the barrier layer and the transistor device, the polar compound semiconductor layer including a two-dimensional electron gas therein.

In Example 10, the polar compound semiconductor layer of Example 9 has a first polarity at a surface defining a junction with the barrier layer and a second different polarity at opposite surface.

In Example 11, the first polarity of Example 9 is +c and the second polarity is −c.

In Example 12, the transistor device of Example 9 includes a gate electrode and a source region and a drain region on respective sides of the gate electrode, the apparatus further including a gate dielectric layer between the polar compound semiconductor layer and the gate electrode.

In Example 13, the polar compound semiconductor layer of Example 9 includes a material including a Wurtzite crystal structure.

In Example 14, the polar compound semiconductor layer of Example 9 includes gallium nitride.

In Example 15, the barrier layer of Example 14 includes aluminum gallium nitride.

Example 16 is a system including a computing device including a microprocessor coupled to a printed circuit board, the microprocessor comprising a plurality of transistor devices on a polar semiconductor layer comprising a two-dimensional electron gas therein, the polar semiconductor layer comprising a layer of a composite substrate including a barrier layer, wherein polar semiconductor layer is disposed between the plurality of transistor devices and the barrier layer.

In Example 17, the polar compound semiconductor layer of Example 16 has a first polarity at a surface defining a junction with the barrier layer and a second different polarity at opposite surface.

In Example 18, the first polarity of Example 17 is +c and the second polarity is −c.

In Example 19, each of the plurality of the transistor devices of Example 16 includes a gate electrode disposed on a dielectric layer.

In Example 20, the polar compound semiconductor layer of Example 16 includes a material comprising a Wurtzite crystal structure.

In Example 21, the polar compound semiconductor layer of Example 16 includes gallium nitride.

The above description of illustrated implementations, including what is described in the Abstract, is not intended to be exhaustive or to limit the invention to the precise forms disclosed. While specific implementations of, and examples for, the invention are described herein for illustrative purposes, various equivalent modifications are possible within the scope, as those skilled in the relevant art will recognize.

These modifications may be made to the invention in light of the above detailed description. The terms used in the following claims should not be construed to limit the invention to the specific implementations disclosed in the specification and the claims. Rather, the scope is to be determined entirely by the following claims, which are to be construed in accordance with established doctrines of claim interpretation.

What is claimed is:

1. A method comprising:
   forming a barrier layer on a polar compound semiconductor layer on a sacrificial substrate;
   coupling the sacrificial substrate to a carrier substrate to form a composite structure wherein the barrier layer is disposed between the polar compound semiconductor layer and the carrier substrate;
   separating the sacrificial substrate from the composite structure to expose the polar compound semiconductor layer; and
   forming at least one circuit device, wherein the at least one circuit device comprises a gate electrode and a source region and a drain region on respective sides of the gate electrode, the at least one circuit device further comprising a gate dielectric layer between the polar compound semiconductor layer and the gate electrode, and wherein the gate dielectric layer is between and in contact with sidewalls of the source region and the drain region.

2. The method of claim 1, wherein the polar compound semiconductor layer has a first polarity at a junction with the barrier layer and a second different polarity at the surface exposed by separating the sacrificial substrate from the compound structure.

3. The method of claim 2, wherein the first polarity is +c and the second polarity is −c.

4. The method of claim 1, wherein forming a barrier layer comprises depositing a material that induces a two-dimensional electron gas in the polar compound semiconductor layer.

5. The method of claim 1, wherein prior to coupling, the method comprises forming a perforation region in the compound semiconductor layer and separating the sacrificial substrate comprises separating at the perforation region.

6. The method of claim 5, wherein after separating the sacrificial substrate, the method further comprises thinning the compound semiconductor layer.

7. An apparatus comprising:
a barrier layer on a substrate;
a transistor device on the barrier layer; and
a polar compound semiconductor layer disposed between the barrier layer and the transistor device, the polar compound semiconductor layer comprising a two-dimensional electron gas therein, wherein the transistor device comprises a gate electrode and a source region and a drain region on respective sides of the gate electrode, and a gate dielectric layer between the polar compound semiconductor layer and the gate electrode, and wherein the gate dielectric layer is between and in contact with sidewalls of the source region and the drain region.

8. The apparatus of claim 7, wherein the polar compound semiconductor layer has a first polarity at a surface defining a junction with the barrier layer and a second different polarity at opposite surface.

9. The apparatus of claim 7, wherein the first polarity is +c and the second polarity is −c.

10. The apparatus of claim 7, wherein the polar compound semiconductor layer comprises a material comprising a Wurtzite crystal structure.

11. The apparatus of claim 7, wherein the polar compound semiconductor layer comprises gallium nitride.

12. The apparatus of claim 11, wherein the barrier layer comprises aluminum gallium nitride.

13. A system comprising:
a computing device comprising a microprocessor coupled to a printed circuit board, the microprocessor comprising a plurality of transistor devices on a polar semiconductor layer comprising a two-dimensional electron gas therein, the polar semiconductor layer comprising a layer of a composite substrate comprising a barrier layer, wherein the polar semiconductor layer is disposed between the plurality of transistor devices and the barrier layer, wherein each of the transistor devices comprises a gate electrode and a source region and a drain region on respective sides of the gate electrode, and a gate dielectric layer between the polar compound semiconductor layer and the gate electrode, and wherein the gate dielectric layer is between and in contact with sidewalls of the source region and the drain region.

14. The system of claim 13, wherein the polar semiconductor layer has a first polarity at a surface defining a junction with the barrier layer and a second different polarity at opposite surface.

15. The system of claim 13, wherein the first polarity is +c and the second polarity is −c.

16. The system of claim 13, wherein the polar semiconductor layer comprises a material comprising a Wurtzite crystal structure.

17. The system of claim 13, wherein the polar semiconductor layer comprises gallium nitride.

* * * * *